United States Patent
Dunne

(10) Patent No.: US 8,034,713 B2
(45) Date of Patent: Oct. 11, 2011

(54) METHOD FOR STACKING AND INTERCONNECTING INTEGRATED CIRCUITS

(75) Inventor: Brendan Dunne, Gardanne (FR)

(73) Assignee: STMicroelectronics (Rousset) SAS, Rousset (FR)

(*) Notice: Subject to any disclaimer, the term of this patent is extended or adjusted under 35 U.S.C. 154(b) by 79 days.

(21) Appl. No.: 12/625,196

(22) Filed: Nov. 24, 2009

(65) Prior Publication Data

US 2010/0133645 A1    Jun. 3, 2010

(30) Foreign Application Priority Data

Nov. 26, 2008  (FR) .................................... 08 06644

(51) Int. Cl.
*H01L 21/44*  (2006.01)

(52) U.S. Cl. ............... 438/667; 438/109; 257/E23.067; 257/E23.174

(58) Field of Classification Search .............. 438/667; 257/E23.067, E23.174
See application file for complete search history.

(56) References Cited

U.S. PATENT DOCUMENTS

| | | | |
|---|---|---|---|
| 6,642,081 B1 | 11/2003 | Patti | |
| 7,786,587 B2 * | 8/2010 | Hoshino et al. | 257/760 |
| 2002/0017710 A1 * | 2/2002 | Kurashima et al. | 257/686 |
| 2002/0135062 A1 | 9/2002 | Mastromatteo et al. | |
| 2005/0101054 A1 | 5/2005 | Mastromatteo et al. | |
| 2008/0203556 A1 | 8/2008 | Huang | |
| 2009/0134527 A1 * | 5/2009 | Chang | 257/777 |

FOREIGN PATENT DOCUMENTS

| | | |
|---|---|---|
| JP | 2002-050736 A | 2/2002 |
| WO | 99/56508 A1 | 11/1999 |

* cited by examiner

*Primary Examiner* — Michael Lebentritt
*Assistant Examiner* — Daniel Whalen
(74) *Attorney, Agent, or Firm* — Lisa K. Jorgenson; Robert Iannucci; Seed IP Law Group PLLC

(57) ABSTRACT

A method for stacking and interconnecting integrated circuits includes providing at least two substrates; forming a trench in each substrate; filling the trench with an insulating material; forming, in each substrate, at least one conductive area; thinning each substrate until reaching at least the bottom of the trench, to obtain in each substrate at least one electrically insulated region within the closed perimeter delineated by the trench; bonding the substrates together; making at least one hole through the bonded substrates so that the hole passes at least partially through the conductive areas and passes through the insulated region of each substrate; and filling the hole with an electrically conductive material so as to obtain a conductive column that traverses the isolated region of each substrate and is in lateral electrical contact with the conductive areas.

18 Claims, 7 Drawing Sheets

METHOD FOR STACKING AND INTERCONNECTING INTEGRATED CIRCUITS

BACKGROUND

1. Technical Field

The present disclosure relates to the manufacture of integrated circuits and more particularly to the manufacture of a stack of integrated circuit chips.

2. Description of the Related Art

The interconnection of integrated circuits has become more and more complex with the increasing complexity of the integrated circuits. In order to minimize as much as possible the area necessary to interconnect integrated circuits, it is generally necessary to provide interconnection means such as chip carriers or high-density integrated circuit cards.

For years, the realization techniques of three-dimensional integrated circuits have been seen as the ideal solution to reduce the surface occupied by an ensemble of interconnected integrated circuits. However, various technological constraints prevented the rapid implementation of such a solution.

Conventionally, a three-dimensional integrated circuit is a stack of two or more semiconductor chips in which integrated circuits are embedded. Identical or heterogeneous integrated circuits can be stacked to obtain a high-density 3D circuitry, for example a stack of N memory chips allowing an extended memory array to be realized within a reduced volume.

Stacked integrated circuits are often realized at wafer level, that is to say when the chips—also called dies—have not yet been separated from the wafer within which they were manufactured. The wafer-on-wafer stacking methods comprise stacking two or more wafers that are aligned, interconnected and bonded, and then cut to obtain discrete stacked integrated circuits.

To that end, through-wafer vias are conventionally created before the different wafers are bonded. The wafers can be bonded either before or after a thinning step and can be bonded either front face-to-front face or front face-to-back face. The conventional wafer bonding methods thus include the simultaneous (i.e., at the time of bonding) electrical interconnection of contact pads realized either on a front face or on a back face of the wafers, or both faces. These methods are not very practical to implement when several wafers are stacked. After a step of alignment of the different wafers, the bonding and interconnection of the wafers is a delicate operation due to their large sizes. In addition, the interconnect material, for example a solder, does not offer the flexibility and ductility that may be desired for assembling large wafers. Finally, the fabrication of through vias in each wafer requires various steps and is often complex and costly to implement. Thus, it is expected that the control of three-dimensional interconnect and alignment techniques will be a major challenge in the near future.

Various different methods have been proposed in order to manufacture through vias, such as the method proposed in U.S. Patent Application No. 2005/0101054. This method comprises forming a trench on the top of a semiconductor wafer. The trench is then filled with a dielectric material. The wafer is then thinned until the bottom of the trench is reached, thereby forming a region that is electrically insulated from the rest of the wafer, delineated by the insulating trench. The material within the electrically insulated region is then removed and the insulated region is filled with an electrically conductive material, which allows the interconnection of contacts on the front and back faces of the wafer.

Another method, disclosed in U.S. Patent Application No. 2008/0203556 proposes an opposite approach. A wafer of a conductive material is used here. Patterned trenches are, as previously, formed and then filled with a dielectric material. The trenches thereby insulate the conductive material that they surround from the rest of the conductive wafer, this material thus forming an interconnection between contacts on the front and back faces.

In U.S. Pat. No. 6,642,081, a stacked integrated circuit is obtained by bonding the front face of a first wafer to a face of a second wafer and then thinning the back face of the first wafer until a thickness is obtained that is such that portions of conductive plugs go past the back face of the thinned wafer. The extremities of these plugs are then bonded to contact pads situated upon a front face of a third wafer.

The document JP 2002 050 736 A discloses, in relation with its FIGS. 4A to 4D, a method for stacking at least two wafers wherein a hole is made that penetrates into the two wafers and into electrodes of each substrate. The hole is electrically insulated by means of a selective oxide film that does not deposit upon the electrode materials. A conductive material, such as solder, is then injected in the hole to form a link electrode that is in lateral contact with the electrodes of each wafer.

It may be desired to provide an alternative method to that of document JP 2002 050 736 for stacking and interconnecting integrated circuits in a straightforward and reliable manner that does not require a selective oxide.

The document US 2005/0101054 discloses a method of forming a via comprising steps of forming a trench in a wafer, filling the trench with a dielectric material, forming a contact pad (8, 12) above the trench, thinning the wafer from its rear face until the bottom of the trench is reached, removing the semiconductor material inside of the trench so as to create a cavity, then growing metal in the cavity so as to obtain a conductive via that is in head-on electrical contact with the bottom side of the contact pad.

BRIEF SUMMARY

Some embodiments of the disclosure relate to a method for stacking and interconnecting integrated circuits, comprising the steps of providing at least two substrates; forming in each substrate a trench or well delineating a closed perimeter in each substrate; filling the trench or the well of each substrate with an insulating material; forming, in each substrate, at least one integrated circuit and at least one conductive area connected to the integrated circuit; thinning each substrate from the bottom until reaching at least the bottom of the trench or of the well, to obtain in each substrate an electrically insulated region within the closed perimeter delineated by the trench or the well; bonding the substrates together so as to form a stack of substrates; making at least one hole through the bonded substrates so that the hole passes at least partially through the conductive areas and passes through the insulated region of each substrate; and filling the hole with an electrically conductive material so as to obtain a conductive column that traverses the insulated region of each substrate and is in lateral electrical contact with the conductive areas.

According to one embodiment, the method comprises a step of dicing the stack of substrates into at least one individual die stack.

According to one embodiment, the step of dicing is performed before the steps of creating at least one hole through the bonded substrates.

According to one embodiment, the method comprises a step of thinning at least one substrate performed after the step of bonding the substrates.

According to one embodiment, the method comprises a step of partially removing the conductive material from at least one conductive column and a step of replacing the removed conductive material by a non-conductive material.

According to one embodiment, the method comprises a step of realizing in at least one of the substrates, before the bonding of the substrates, conductive vias that interconnect at least two conductive areas of the substrate intended to also be interconnected by a conductive column.

According to one embodiment, the method comprises the steps of bonding at least a first, a second and a third substrate; and interconnecting at least one conductive area of the first substrate with at least one conductive area of the second substrate by means of a first conductive column by not connecting any conductive area of the third substrate to the conductive column.

According to one embodiment, the method comprises the steps of bonding at least a first and a second substrate to obtain an intermediary stack of substrates; interconnecting at least one conductive area of the first substrate with at least one conductive area of the second substrate by means of a first conductive column; bonding at least a third substrate to intermediary stack to obtain a final stack of substrates; and interconnecting at least one conductive area of the first and/or the second substrate with at least one conductive area of the third substrate by means of a second conductive column.

Some embodiments of the disclosure also relate to a stack of chips comprising at least two stacked substrates each comprising at least one integrated circuit and one conductive area connected to the integrated circuit; the stack comprises at least a conductive column that penetrated into the two substrates and is in lateral electrical contact with the conductive areas, and that passes through one electrically insulated region in each substrate, the insulated region preventing the conductive column from being in electrical contact with each substrate, the insulated region delineated by a trench or a well filled with a insulating material.

According to one embodiment, the conductive column extends through a hole, an end of which is partially filled by an electrically non-conductive material (82).

According to one embodiment, the stack of chips comprises at least a first, a second and a third substrate, at least a first conductive column interconnecting at least one conductive area of the first substrate with at least one conductive area of the second substrate, and at least a second conductive column interconnecting at least one conductive area of the first and/or the second substrate with one conductive area of the third substrate.

BRIEF DESCRIPTION OF THE SEVERAL VIEWS OF THE DRAWINGS

These characteristics will be better understood in light of the following description of embodiments of a method for stacking and interconnecting integrated circuits according to the disclosure, in relation with but not limited to the following figures, in which.

DETAILED DESCRIPTION

Embodiments of the present disclosure comprise a step of bonding at least two wafers before forming electrically-conductive columns in the bonded wafers. A wafer stack is obtained that it is not-yet-interconnected and does not yet have the means for interconnection. Next, collective holes are formed through the wafer stack. The term "collective hole" is taken to mean a hole that traverses several wafers. A conductive material is then inserted into the holes in order to obtain conductive columns that can be taken to be "collective through vias", that is to say through vias that traverse several wafers and electrically interconnect at least some conductive areas of the wafers. When the wafer comprises a conductive or semi-conductive material, embodiments of the disclosure may comprise preliminary steps of forming insulated regions where the holes are to be made, in order to insulate the conductive material that will be inserted into these holes in order to form the conductive columns.

Embodiments of the present disclosure will now be described in greater detail. These embodiments are disclosed in a non-limiting manner and are susceptible of different implementations and variations within the knowledge of those skilled in the art. In the embodiments described below, the material of the wafer is a semiconductor material and steps are provided to prevent short-circuits between the conductive columns and the semiconductor material. However, embodiments of the present disclosure can also be implemented with other types of substrates. Therefore, the term "wafer" is not limited to semiconductor wafers and shall refer to any type of substrate upon which electronic circuits can be integrated or embedded.

FIGS. 1A to 1H show different steps of a first embodiment of a method for stacking and interconnecting integrated circuits according to the disclosure. The method is implemented by means of wafers in which several integrated circuits are realized. For the sake of simplicity, only partial areas of the wafers are shown. These zones correspond to a region of a wafer comprising an integrated circuit. For reasons of clarity, the drawings are not to scale and are stretched in the vertical axis corresponding to the thickness of the wafers.

Figure 1A:
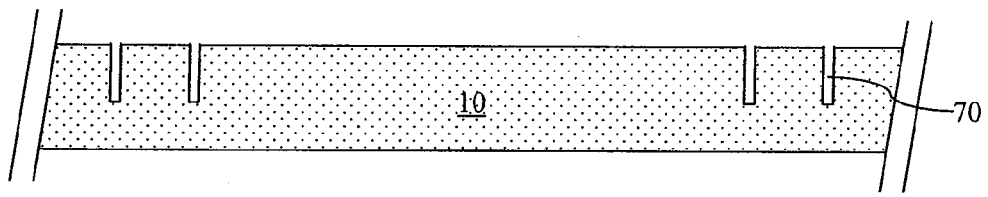
FIGS. 1A to 1H show in cross-sectional views different steps of a first embodiment of the method according to the disclosure.

The method comprises a preliminary step of forming recesses on the front face of a wafer 10, as shown in FIG. 1A. In FIG. 1A, the recesses are trenches 70, although other types of recesses could be formed. This preliminary step may comprise steps of deposition of a photoresist layer, exposure of the photoresist with a photomask, development of the photoresist to obtain windows in the photoresist, etching of the wafer within the windows in the photoresist, removal of the photoresist, etc. The wafer etching step may be performed by deep reactive ion etching (DRIE). Each trench delineates a closed perimeter in the wafer and is for example of an annular shape.

Although such an annular shape is easily and commonly used in microelectronics, the trenches may be of a different shape, such as rectangular or polygonal, depending upon the processing methods used and the application desired. Furthermore, the walls of the trench can be vertical, angled or any other form that may be desired or imposed by the process used.

Figure 1B:
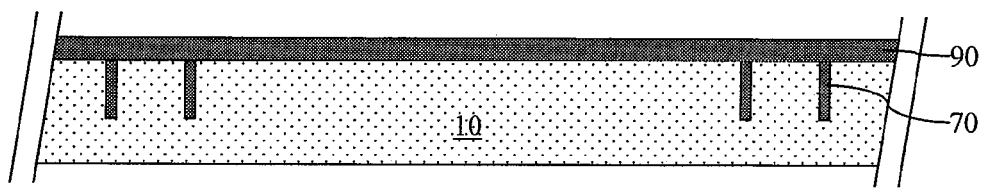

During a step shown in FIG. 1B, the trenches are filled with an electrically insulating material, for example a dielectric material 90. During this step, the wafer 10 is simultaneously covered with a layer of the material 90, forming a dielectric layer on the front face of the wafer. The dielectric material 90 can be for example a tetraethyl orthosilicate (TEOS) oxide deposited using known methods such as chemical vapor deposition. Depending upon the process conditions such as temperature, the step of filling the trenches can optionally be done after the formation of integrated circuits on the front face of the wafer.

The step of filling trenches 70 can be performed in pre-processing or mid-processing so as to deposit the dielectric material 90 without temperature constraints. Usually, the temperature for depositing a TEOS oxide is typically around 460 to 480° C. The dielectric material made this way has a satisfactory dielectric constant and thickness, and it is easy to fill the trenches.

If the layer of dielectric material 90 is deposited during the pre-processing phase, it is then removed for example using a CMP process ("Chemical Mechanical Polishing", combining mechanical abrasion and chemical etching).

If the dielectric material 90 is deposited onto the front face of the wafer during mid-processing, the layer of dielectric can be used in the fabrication of integrated circuits, for example as an IMD (Inter Metal Dielectric) layer. In this case, the dielectric layer does not need to be removed. It is assumed hereinafter that this solution has been chosen, so that the layer of dielectric material 90 appears in the following figures.

After forming the trenches 70 and depositing the dielectric material 90, the usual process of manufacturing areas of integrated circuits can be performed or continued (forming transistors, forming and etching metal layers on the front face of the wafer, etc.).

Figure 1C:
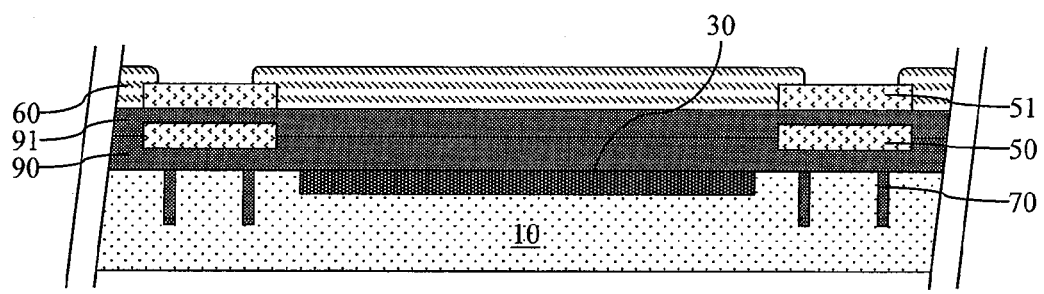

A step shown in FIG. 1C is thus reached, during which the wafer 10 comprises integrated circuits 30 (only one integrated circuit 30 is shown in the partial view of FIG. 1C and the following, and is schematically represented in block form). While manufacturing the integrated circuits 30, one or more conductive areas such as contact pads 50 have also been formed on the dielectric material 90 on the front face of wafer 10. The conductive areas 50 are connected to integrated circuits 30, are located above the trenches 70 and are electrically insulated from the wafer by the dielectric layer 90. These conductive areas can comprise any known conductive material, such as aluminum, copper, polysilicon, tungsten, alloys, etc. depending upon the implemented fabrication process.

Further dielectric layers and conductive areas may also have been formed. In the example shown in FIG. 1C, the wafer also comprises a dielectric layer 91 and conductive areas such as contact pads 51. A passivation layer 60 has also been deposited on the top of the wafer 10.

Figure 1D:
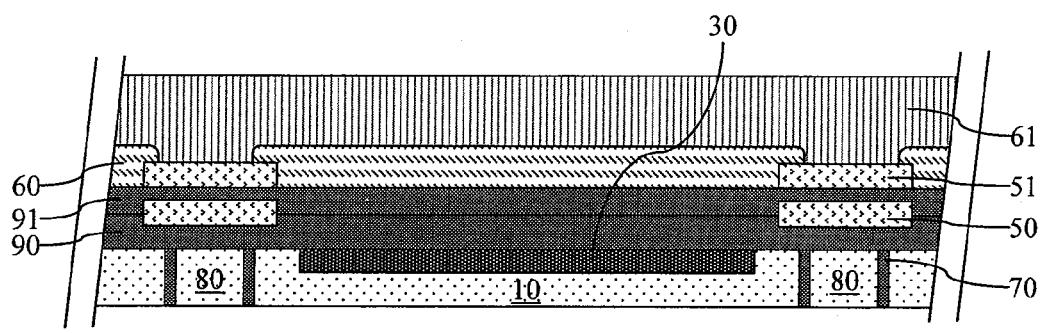

During a step shown in FIG. 1D, the front face of wafer 10 is placed upon a temporary wafer holder 61. The wafer is then subjected to a thinning step by abrasion and/or etching of the back face thereof until at least the bottoms of the trenches 70 are reached. The thinning step, generally referred to as "back-lap" or "backgrinding", is performed by mechanical abrasion or chemical etching of the back face of the wafer, or by mechanical abrasion followed by chemical etching. Known techniques are for example chemical mechanical polishing, mechanical grinding, wet etching, atmospheric downstream plasma dry chemical etching, and the like. The thinning step may continue beyond the point where the bottoms of the trenches 70 are reached.

Figure 2:
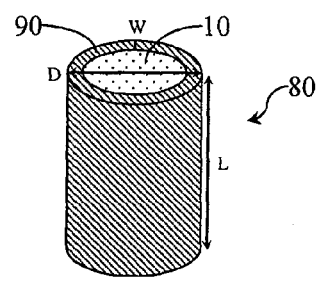
FIG. 2 is a perspective view of an example of an insulated region realized during steps illustrated in FIGS. 1A to 1D, FIGS. 3A and 3B show in cross-sectional views two steps of a second embodiment of the method according to the disclosure.

Insulated regions 80 are thus obtained. The regions 80 are electrically-insulated relative to the remainder of the wafer since they are surrounded by the insulating trenches 70 (that may be considered as parts of the insulated regions 80). As an example, and as shown in FIG. 2, an insulated region 80 has a diameter D of approximately 50 microns including the trench 70 width, a trench width W of approximately 5 microns and a depth L of approximately 100 microns.

Figure 1E:
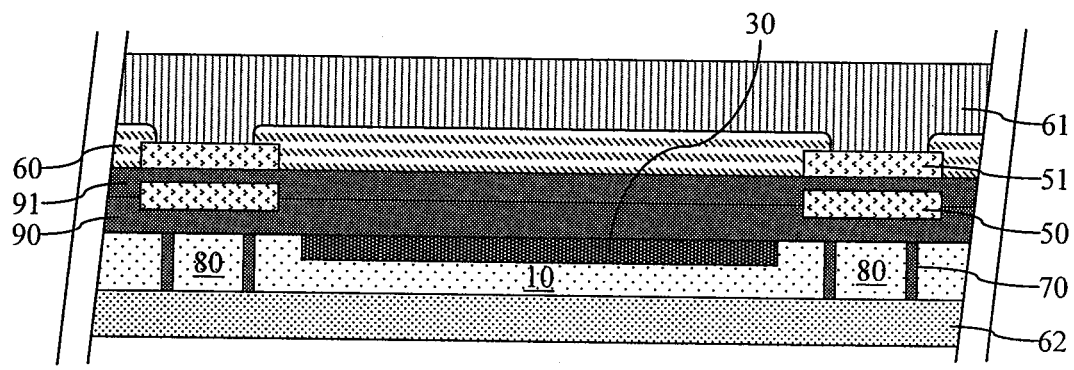

A layer of adhesive material 62 is then applied to the bottom of wafer 10, as shown in FIG. 1E.

Figure 1F:
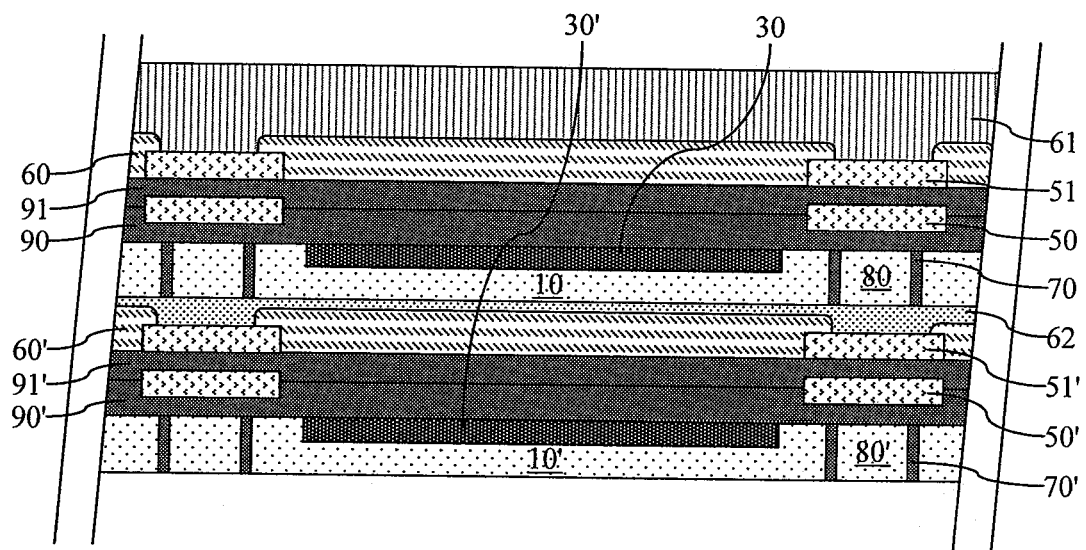

It is now assumed that a second wafer 10', shown in FIG. 1F, is then realized or was realized before or at the same time as wafer 10. Like wafer 10, wafer 10' has integrated circuits 30', (only one being shown) insulated regions 80' delineated by insulating trenches 70', contact pads 50', 51' arranged above each insulated region, dielectric layers 90', 91' upon which the contact pads respectively lie and a passivation layer 60'. Alternatively, the adhesive layer 62 can be applied to the front face of wafer 10' instead of to the back face of wafer 10.

Integrated circuits 30' can be either the same as integrated circuits 30 of wafer 10 or of a different type. The second wafer 10' can be thinned either before or after bonding with wafer 10 (depending upon which face of wafer 10' is bonded with wafer 10).

Then, as shown in FIG. 1F, the second wafer 10' is aligned and bonded to wafer 10, here in a front face-to-back face configuration. The front face of wafer 10' and the back face of wafer 10 are thus covered by the adhesive layer 62. In other embodiments, a face-to-face bonding may also be provided.

The adhesive layer 62 assures a proper bonding of the first and second wafers 10, 10' having the necessary flexibility. The material of adhesive layer 62 can also possess other properties such as thermal dissipation properties, physical protection properties, etc. However, other methods of wafer bonding known by those skilled in the art may be used, for example by spin coating of an adhesive polymer layer, etc.

Figure 1G:
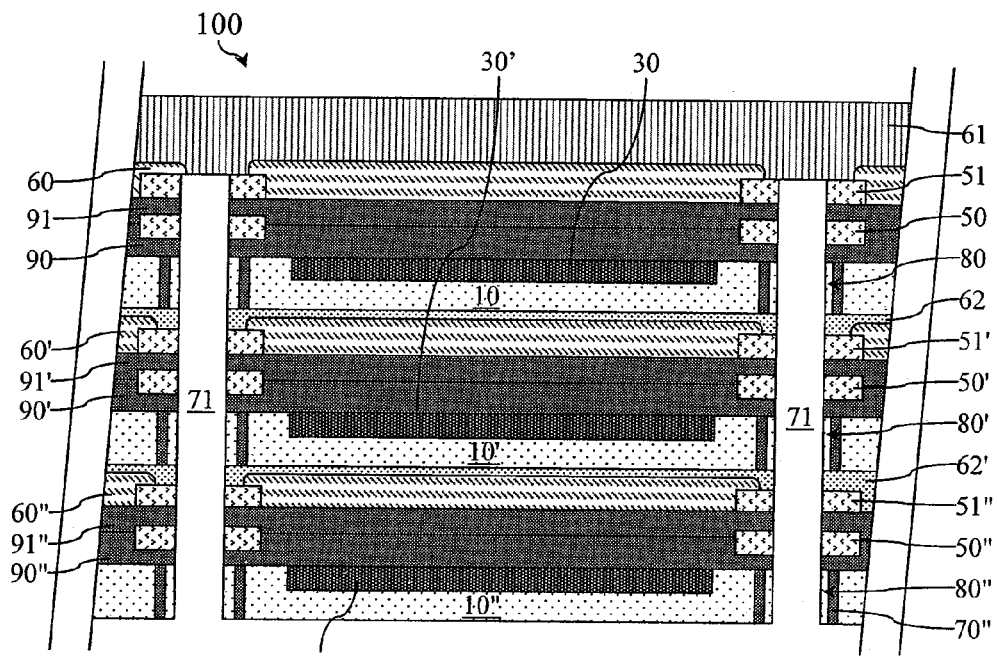

Further steps of the method of the disclosure can be provided to add other wafers to the initial two-wafer assembly. The other wafers are stacked in a similar manner with their insulated regions vertically aligned. For example, as shown in FIG. 1G, a third wafer 10" is stacked with wafers 10, 10'. Like wafers 10, 10', wafer 10" has integrated circuits 30", insulated regions 80" delineated by insulating trenches 70", contact pads 50", 51" arranged above the insulated regions, dielectric layers 90", 91" and a passivation layer 60". A second adhesive layer 62' is provided to bond wafer 10" to the stack of wafers 10, 10'.

A final stack 100 of wafers is thus obtained. Holes 71 are then made through the different wafers, for example by means of a laser. Holes 71 pass through wafer 10", dielectric layers 90", 91", contact pads 50", 51", adhesive layer 62', wafer 10', dielectric layers 90', 91', contact pads 50', 51', adhesive layer 62, wafer 10, dielectric layers 90, 91 and contact pads 50, 51. The holes 71 are made so that they pass through the insulated regions 80, 80', 80" that are vertically aligned in the wafer stack.

Figure 1H:
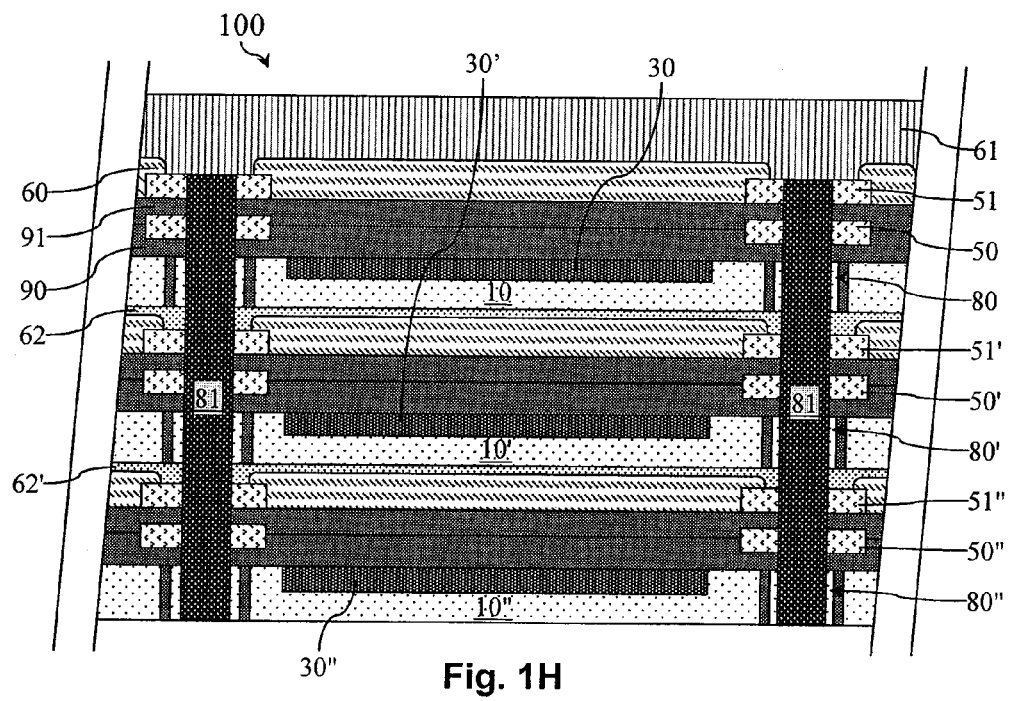

During a step shown in FIG. 1H, a conductive material is then deposited into holes 71. Methods such as electrolysis or conductive paste application can be used to fill holes 71 with the desired conductive material. Columns 81 of conductive material are thus realized inside the holes 71. The conductive columns are insulated from the material of wafers 10, 10', 10"

thanks to the trenches filled with the dielectric material. In addition, since the conductive columns 81 traverse the different contact pads 50, 51, 50', 51', 50", 51" of the stack, a lateral electrical contact is obtained between the edges of the contact pads within their pierced areas and the edges of the conductive columns passing through the pierced areas of the contact pads. Wafer interconnections are therefore obtained.

Figure 1I:
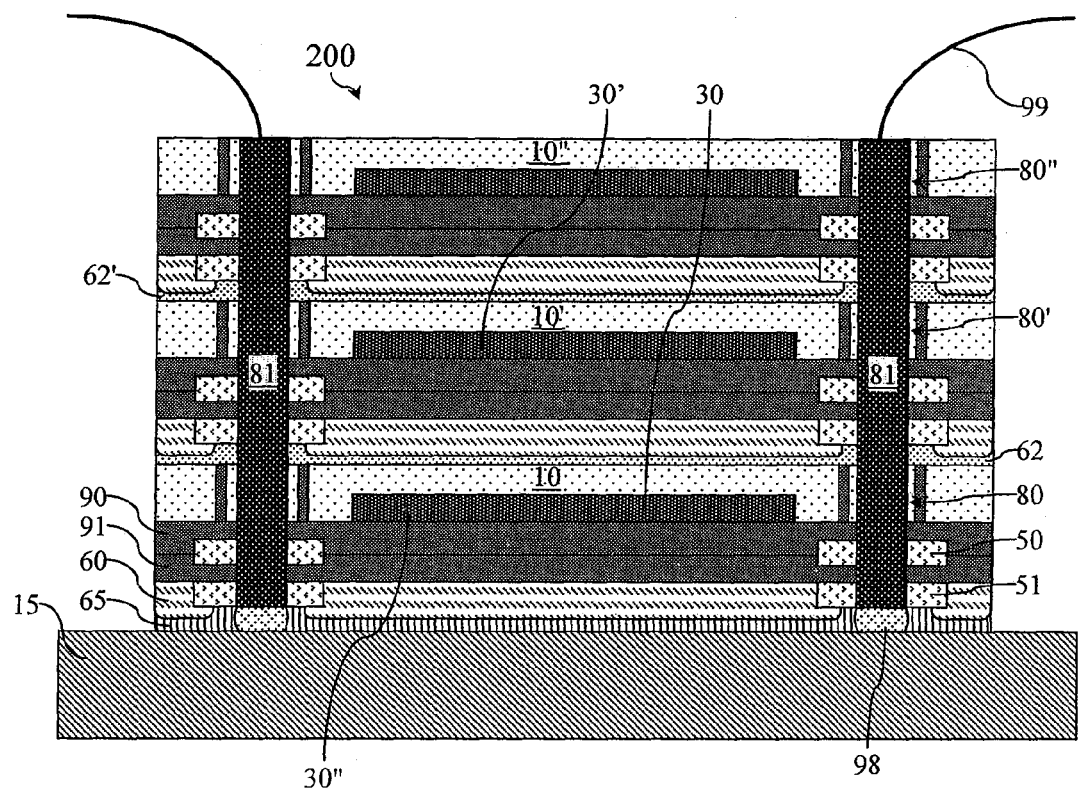
FIG. 1I shows a die stack obtained from a wafer stack shown in FIG. 1H.

Finally, as shown in FIG. 1I, the wafer stack is removed from the temporary holder 61 and is diced into individual die stacks 200 of the "die-on-die" type. For use of the die stacks, connections with external elements can be realized using the ends of the conductive columns. For example, wire bonds 99 may be provided by ultrasonically bonding wires on the top end of the conductive columns. Solder bumps 98 can also be provided under the bottom ends of the conductive columns, to connect the die stack to an interconnection support 15. A layer of material 65, such as with thermal dissipation properties or to improve the adhesion of the die stack 200 to the support 15, can also be arranged between the stack and the support.

In other embodiments, specific contact pads may be provided at the time of wafer fabrication so that these specific contact pads extend over the accessible face of upper chips or over the accessible face of lower chips of the die stacks. These specific contact pads may be connected to the other contact pads via conductive paths according to conventional re-routing techniques.

Figure 3A:
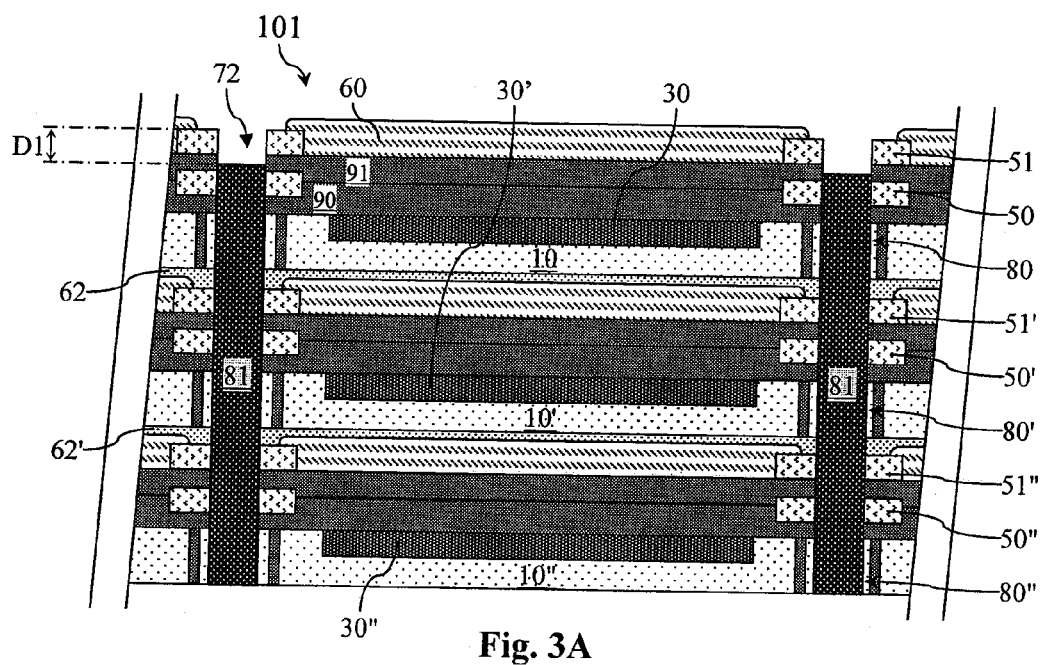
Figure 3B:
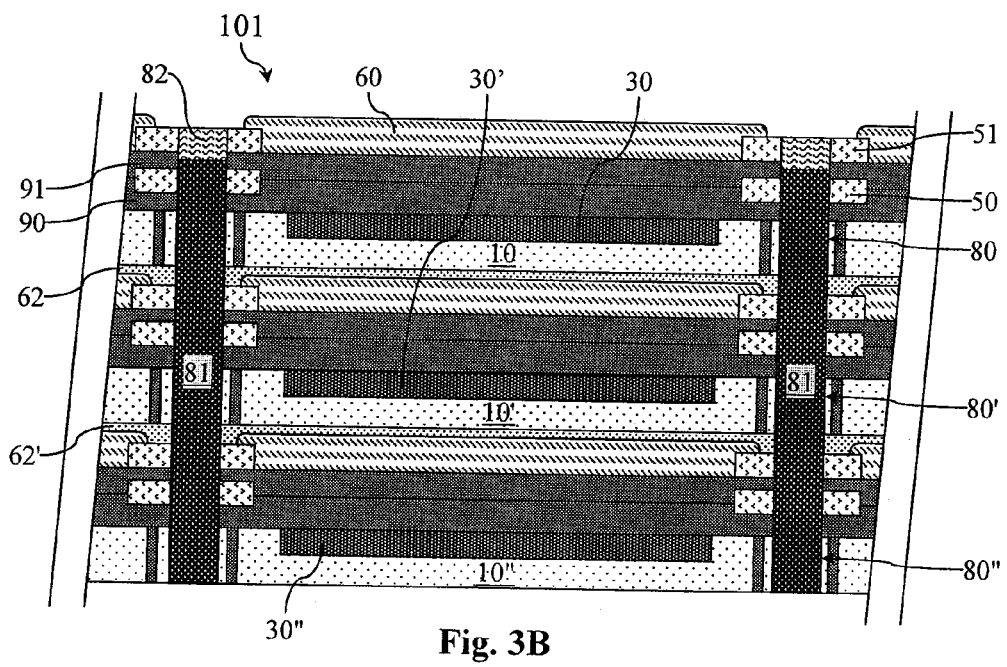

FIGS. 3A and 3B show a wafer stack 101 made according to a second embodiment of the method of the disclosure. As previously indicated, only an area of each wafer comprising a single integrated circuit is shown.

In this embodiment, three wafers 10, 10', 10" have been fabricated, bonded and interconnected by conductive columns 81 such as in the manner described above. Then, as shown in FIG. 3A, the conductive material is removed in top parts of the conductive columns 81, for example by etching, to a depth D1. A hole 72 is thus obtained. The depth D1 of the hole is chosen so that the contact pads 51 on the front face of the top wafer 10 are no longer connected to the other contact pads that are in contact with the conductive columns. The hole 72 is then filled with a material 82, such as an insulating material, as shown in FIG. 3B.

This embodiment can be implemented for various reasons, for example to block the electrical connections between on one hand the contact pads on the front face of the top wafer and on the other hand the buried contact pads of the top wafer 10 and the contact pads of lower wafers 10', 10". This embodiment may also be implemented when the front face of the top wafer does not contain any contact pads vertically aligned with the conductive columns. In this case, the conductive columns open onto the front face of the top wafer and it may be desired for circuit security to hide the conductive columns so as to prevent a third party from sensing the electrical signals present in the conductive columns.

Figure 4:
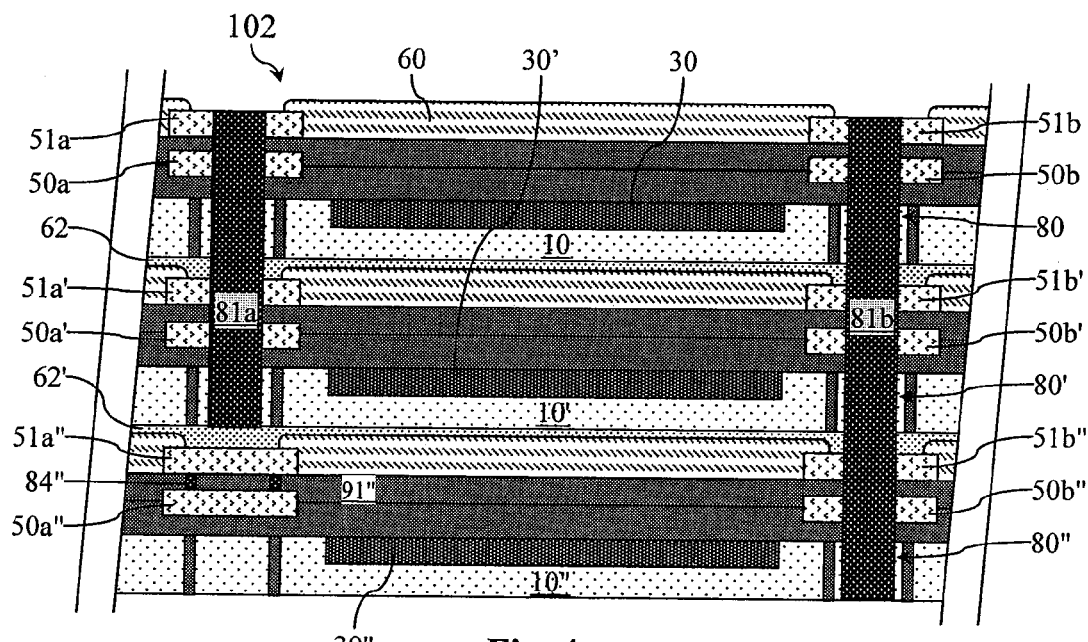
FIG. 4 shows a partial cross-sectional view of a wafer stack made in accordance with a third embodiment of the method according to the disclosure.

FIG. 4 shows a wafer stack 102 in accordance with a third embodiment of the method of the disclosure.

In this embodiment, two wafers 10, 10' have been fabricated and bonded as described above. A first hole has been formed completely through wafers 10, 10' and filled with a conductive material so as to create a first conductive column 81*a* that interconnects vertically-aligned contact pads 50*a*, 51*a* of wafer 10 and 50*a*', 51*a*' of wafer 10'. A third wafer 10" was then bonded to wafers 10, 10' to obtain a stack of wafers 10, 10', 10". A second hole was then formed, completely traversing the wafer stack and filled with a conductive material so as to create a second conductive column 81*b* that interconnects vertically-aligned contact pads 50*b*, 51*b* of wafer 10, 50*b*', 51*b*' of wafer 10' and 50*b*", 51*b*" of wafer 10".

Additionally, when the wafer 10" was processed to create the contact pads 50*a*", 51*a*", conventional conductive vias 84" were fabricated to interconnect the contact pads 50*a*", 51*a*", for example by forming openings in a dielectric layer 91" and then filling the openings with a conductive material.

Figure 5:
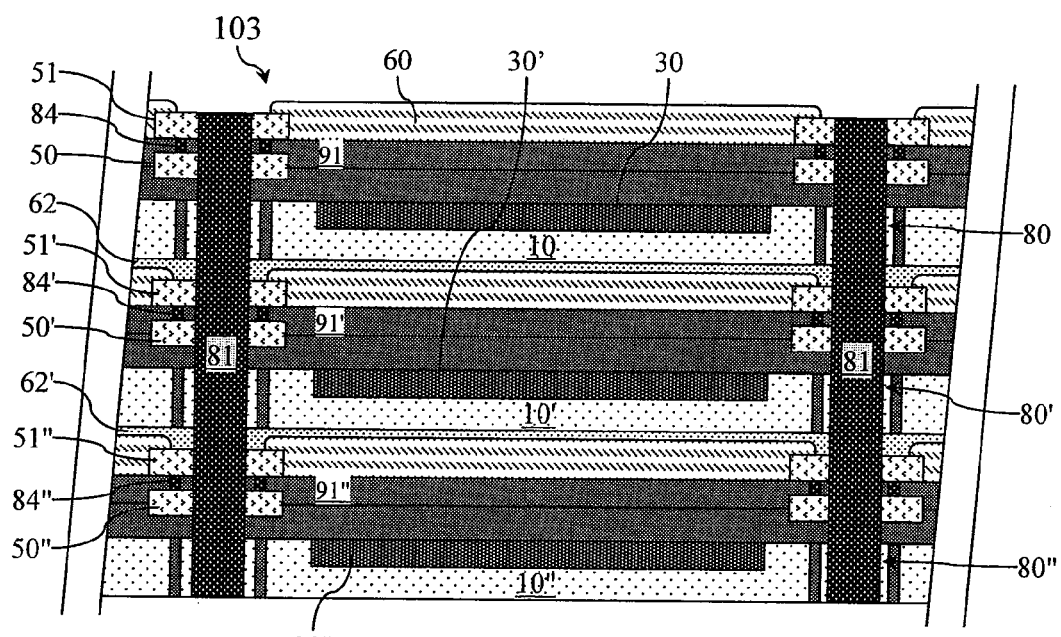
FIG. 5 shows a partial cross-sectional view of a wafer stack made in accordance with a fourth embodiment of the method according to the disclosure.

FIG. 5 shows a wafer stack 103 in accordance with a fourth embodiment of the method of the disclosure.

In this embodiment, a stack of wafers 10, 10', 10" has been realized. Wafer 10 comprises contact pads 50, 51, wafer 10' comprises contact pads 50', 51' and wafer 10" comprises contact pads 50", 51". Conductive vias 84 pass through a dielectric layer 91 and interconnect contact pads 50, 51 of wafer 10. Likewise, conductive vias 84' pass through a dielectric layer 91' and interconnect contact pads 50', 51' of wafer 10'. Conductive vias 84" pass through a dielectric layer 91" and interconnect contact pads 50", 51" of wafer 10".

Wafers 10, 10', 10" have been bonded and connected as described above in relation to FIGS. 1E to 1H, forming conductive columns 81. Conductive columns 81 interconnect contact pads 50, 51 of wafer 10 with contact pads 50', 51' of wafer 10' and with contact pads 50", 51" of wafer 10". The vias 84, 84', 84" were also formed in each wafer and allow a better interconnection (lower serial resistance) to be obtained between contact pads belonging to the same wafer, here between contact pads 50 and 51, 50' and 51', and 50" and 51".

Figure 6:
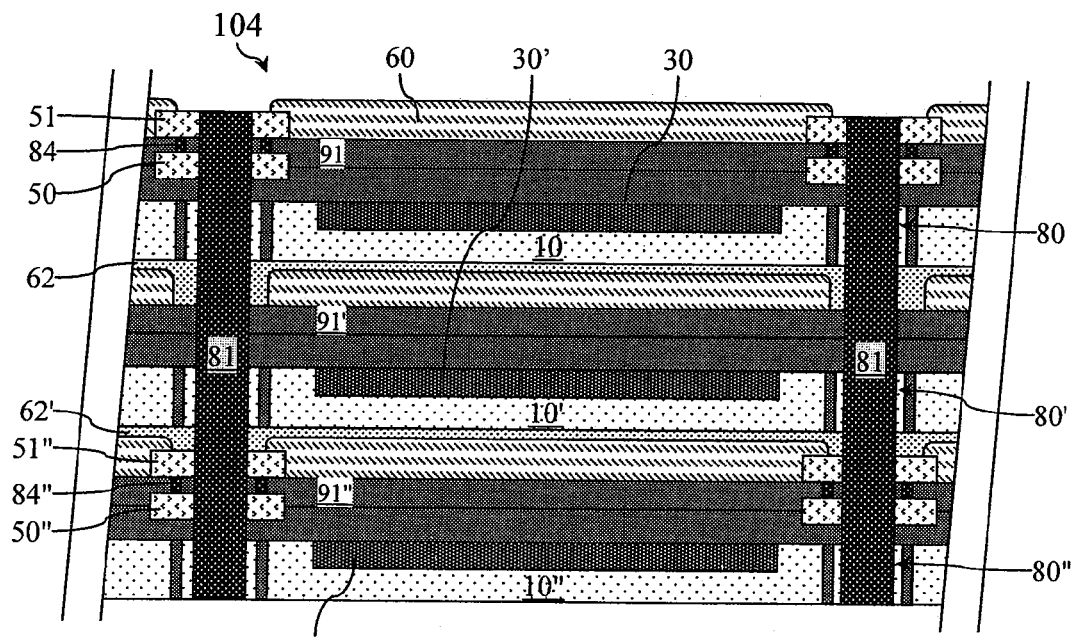
FIG. 6 shows a partial cross-sectional view of a wafer stack made in accordance with a fifth embodiment of the method according to the disclosure.

FIG. 6 is a view of a stack 104 of wafers in accordance with a fifth embodiment of the method of the disclosure. The wafer stack 104 only differs from stack 103 in that at least one conductive column 81 does not pass through contact pads of wafer 10', so that the conductive column 81 only interconnects contact pads 50, 51 of wafer 10 and contact pads 50", 51" of wafer 10". Of course, some other contact pads of wafer 10' may be connected to contact pads of wafer 10, 10" through a conductive column situated in another region of the wafers, which is not shown in the figure.

Generally speaking, those skilled in the art will note that the different types of interconnections that have been described above, by means of conductive columns, can be combined within the same wafer stack to realize different interconnections between different contacts pads of the integrated circuits embedded within the wafers.

Embodiments that have just been described are susceptible to other variants of realization and applications according to the techniques, equipment and materials known to those skilled in the art wishing to implement the disclosure. Embodiments of the method according to the disclosure may also be applied directly to die stack structures. In this case, the holes are made after the wafer stack has been diced into different chip stacks that are not yet interconnected and the conductive columns are made a posteriori in the different die stacks. Embodiments of the present disclosure may also be implemented in die-on-wafer stacking techniques.

Figure 7A:
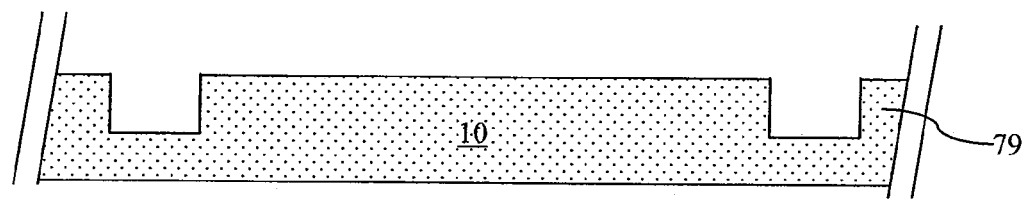
FIGS. 7A to 7C show schematically a variant implementation of steps shown in FIGS. 1A to 1D.
Figure 7B:
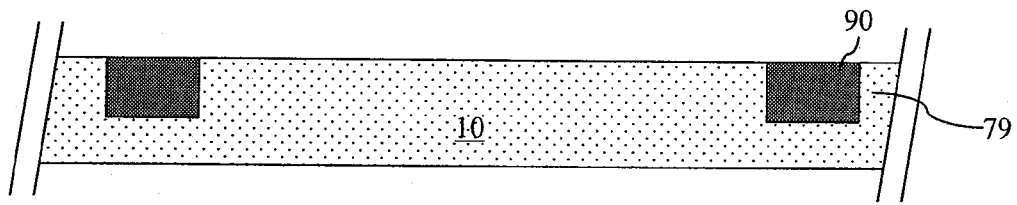
Figure 7C:
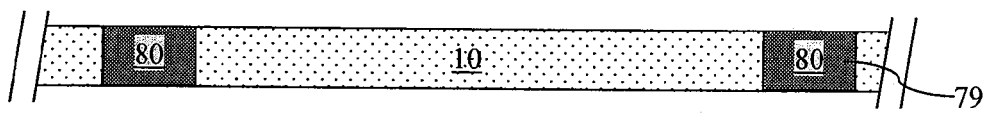

FIGS. 7A to 7C show an alternative method to realize the previously-described insulated regions 80, through which the holes then the conductive columns are formed. During a step shown in FIG. 7A, which replaces the step of FIG. 1A, the recesses formed in the formed in the front face of the wafer 10 are wells 79 instead of trenches 70. For example, wells 79 have a circular shape and have the same diameter and depth as the perimeter delineated by the trenches in FIG. 1A. Then, as shown in FIG. 7B, the wells 79 are filled with a dielectric material 90. When the wafer 10 has been thinned, as schematically shown in FIG. 7C (which is equivalent to FIG. 1D, other elements of the wafer being not represented for the sake of simplicity of the drawings), insulated regions 80 comprising only the dielectric material 90 are obtained, instead of comprising semiconductor material surrounded by dielectric material.

Those skilled in the art will also note that the above-described lateral electrical contact, which is obtained between a conductive column and a conductive area (e.g., a contact pad), may also be obtained with the conductive columns not passing entirely through the entire surface of the conductive areas, but merely passing partially through a portion of the conductive areas, so that at least one angular sector of each conductive column or one edge thereof (if it is not cylindrical) is in lateral electrical contact with the conductive areas.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
providing first and second substrates;
for each substrate:
  forming in the substrate a recess delineating a closed perimeter in the substrate;
  filling the recess with an insulating material;
  forming, in the substrate, an integrated circuit and a first conductive area coupled to the integrated circuit; and
  forming in the substrate an electrically insulated region within the closed perimeter delineated by the recess, the forming including thinning the substrate from a bottom side of the substrate until reaching at least a bottom of the recess;
after forming the insulated region in each substrate, forming a stack of the substrates by bonding the substrates together;
after forming the insulated region in each substrate, making a hole at least partially through the first conductive areas and passing through the insulated region of each substrate; and
obtaining a first conductive column which is in lateral electrical contact with the first conductive areas by filling the hole with an electrically conductive material.

2. A method according to claim 1, comprising dicing the stack of substrates into at least one individual die stack.

3. A method according to claim 2 wherein the dicing is performed before making the hole.

4. A method according to claim 1, comprising partially removing the conductive material from the conductive column and replacing the removed conductive material by a non-conductive material.

5. A method according to claim 1, comprising:
forming a second conductive area in the first substrate, wherein the first conductive column is formed through the second conductive area; and
realizing in the first substrate, before the bonding of the substrates together, a conductive via that interconnects the first and second conductive areas of the first substrate.

6. A method according to claim 1, comprising
bonding a third substrate to the second substrate, the third substrate having a first conductive area, wherein the first conductive column is not connected to the first conductive area of the third substrate.

7. A method according to claim 1, comprising
bonding a third substrate to the second substrate, the second substrate including a second conductive area and the third substrate including a first conductive area; and
interconnecting the second conductive area of the second substrate with the first conductive area of the third substrate by a second conductive column.

8. A method, comprising:
providing first and second substrates;
for each substrate:
  forming, in the substrate, an integrated circuit and a first conductive area coupled to the integrated circuit; and
  forming in the substrate an electrically insulated region having a closed perimeter;
after forming the electrically insulated region in each substrate, forming a stack of the substrates by bonding the substrates together;
after forming the electrically insulated region in each substrate, making a hole at least partially through the first conductive areas and passing through the electrically insulated region of each substrate; and
after bonding the substrates together, obtaining a first conductive column which is in lateral electrical contact with the first conductive areas by filling the hole with an electrically conductive material, the first conductive column being insulated from the substrates by the electrically insulating regions, respectively.

9. A method according to claim 8, comprising dicing the stack of substrates into at least one individual die stack.

10. A method according to claim 9, wherein the dicing is performed before making the hole.

11. A method according to claim 8, comprising partially removing the conductive material from the conductive column and replacing the removed conductive material by a non-conductive material.

12. A method according to claim 8, comprising:
forming a second conductive area in the first substrate, wherein the first conductive column is formed through the second conductive area; and
realizing in the first substrate, before the bonding of the substrates together, a conductive via that interconnects the first and second conductive areas of the first substrate.

13. A method according to claim 8, comprising
bonding a third substrate to the second substrate, the third substrate having a first conductive area, wherein the first conductive column is not connected to the first conductive area of the third substrate.

14. A method according to claim 8, comprising
bonding a third substrate to the second substrate, the second substrate including a second conductive area and the third substrate including a first conductive area; and
interconnecting the second conductive area of the second substrate with the first conductive area of the third substrate by a second conductive column.

15. A method according to claim 8 wherein, for each substrate, forming the electrically insulated region includes forming in the substrate a dielectric-filled trench having a closed perimeter and surrounding the electrically insulated region.

16. A method of manufacturing a chip stack, comprising:
forming first and second integrated circuits in first and second semiconductor substrates, respectively;
forming, in the first substrate, a first electrically insulating region having a closed perimeter that completely laterally surrounds an insulated portion of the first substrate;

forming, in the second substrate, a second electrically insulating region having a closed perimeter that completely laterally surrounds an insulated portion of the second substrate;

forming first and second conductive areas coupled to the first and second integrated circuits, respectively; the first and second conductive areas being aligned with the insulated portions of the first and second substrates;

stacking the first and second semiconductor substrates on top of one another, the stacking including aligning the first and second conductive areas with each other and aligning the insulated portions of the first and second substrates with each other; and after stacking the first and second semiconductor substrates, forming a first conductive column that penetrates into the insulated portions of the first and second substrates and is in lateral electrical contact with the first and second conductive areas.

17. A method according to claim 16, further comprising:
creating a hole in an end of the first conductive column; and
at least partially filling the hole with an electrically insulating material.

18. A method according to claim 16, wherein forming the first electrically insulating region includes:
forming in the first substrate a recess delineating the closed perimeter in the substrate;
filling the recess with an insulating material; and
thinning the substrate from a bottom side of the substrate until reaching at least a bottom of the recess.

* * * * *